United States Patent
Subbaraman et al.

(10) Patent No.: US 10,312,699 B2
(45) Date of Patent: Jun. 4, 2019

(54) METHOD AND SYSTEM FOR ESTIMATING BATTERY OPEN CELL VOLTAGE, STATE OF CHARGE, AND STATE OF HEALTH DURING OPERATION OF THE BATTERY

(71) Applicant: Robert Bosch GmbH, Stuttgart (DE)

(72) Inventors: Anantharaman Subbaraman, Mountain View, CA (US); Nikhil Ravi, Redwood City, CA (US); Reinhardt Klein, Mountain View, CA (US); Gerd Simon Schmidt, Cupertino, CA (US); Christopher Mayhew, Redondo Beach, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/664,814

(22) Filed: Jul. 31, 2017

(65) Prior Publication Data
US 2019/0036356 A1 Jan. 31, 2019

(51) Int. Cl.
*G01N 27/416* (2006.01)
*H02J 7/00* (2006.01)
(Continued)

(52) U.S. Cl.
CPC .......... *H02J 7/0021* (2013.01); *G01R 31/367* (2019.01); *G01R 31/374* (2019.01); *G01R 31/3842* (2019.01); *G01R 31/392* (2019.01)

(58) Field of Classification Search
CPC ............ G01R 31/3679; G01R 31/3624; G01R 31/3606; G01R 31/3648; G01R 31/362; G01R 31/3637; G01R 31/3658; G01R 31/361; G01R 31/36; G01R 31/3655; G01R 31/3668; G01R 19/16542; G01R 31/3627; G01R 31/3634; H01M 10/486;
(Continued)

(56) References Cited

U.S. PATENT DOCUMENTS 7,726,975 B2    6/2010  Christensen et al.
2006/0284600 A1  12/2006  Verbrugge
(Continued)

FOREIGN PATENT DOCUMENTS

EP    1220413 A1    7/2002

OTHER PUBLICATIONS

Chaturvedi et al., "Algorithms for Advanced Battery-Management Systems," IEEE Control Systems Magazine, 2010, pp. 49-68, vol. 30, No. 3, U.S. (20 pages).
(Continued)

*Primary Examiner* — Vinh P Nguyen
(74) *Attorney, Agent, or Firm* — Maginot Moore & Beck LLP

(57) ABSTRACT

A method for monitoring a battery while the battery is connected to a load has been developed. The method includes measuring a first current level flowing through the battery to the load and a first voltage level of the battery at a first time, generating an estimated open cell voltage (OCV) of the battery at the first time based on the first current level, the first voltage level, and a predetermined model of the battery, identifying a first excitation level of the battery at the first time based on the first voltage level, the first current level and a cost optimization process, and identifying at least one of a state of charge (SoC) and state of health (SoH) of the battery using the estimated OCV only in response to the first excitation level being below a predetermined threshold.

16 Claims, 7 Drawing Sheets

(51) Int. Cl.
  *G01R 31/367* (2019.01)
  *G01R 31/374* (2019.01)
  *G01R 31/392* (2019.01)
  *G01R 31/3842* (2019.01)

(58) Field of Classification Search
  CPC ....... H01M 2010/4271; H01M 10/446; H01M 10/482; H01M 2220/20; H01M 10/4207; H01M 10/4257; H01M 10/4228; H01M 10/488; H01M 10/625; H01M 10/44; B60L 2240/549; B60L 2260/44; B60L 11/1864; B60L 11/1862; B60L 3/12; B60L 11/1851; B60L 11/1803; B60L 11/1861; B60L 11/1857; B60L 2240/547; B60L 2240/545; B60W 20/13; B60W 2510/244
  See application file for complete search history.

(56) References Cited

U.S. PATENT DOCUMENTS

| | | |
|---|---|---|
| 2011/0156713 A1 | 6/2011 | Akamine et al. |
| 2011/0309838 A1 | 12/2011 | Lin et al. |
| 2012/0109433 A1 | 5/2012 | Takahashi et al. |
| 2013/0311115 A1 | 11/2013 | Chaturvedi et al. |

OTHER PUBLICATIONS

Dai et al., "Online SOC Estimation of High-power Lithium-ion Batteries used on HEV's," Vehicular Electronics and Safety, International Converence Vehicular Electronics and Safety, 2006, pp. 1-6, China P.R. (6 pages).

Lee et al., "Li-ion battery SOC estimation method based on the reduced order extended Kalman filtering," Journal of Power Sources, 2007, pp. 9-15, vol. 174, Republic of Korea (7 pages).

Piller et al., "Methods for state-of-charge determination and their applications," Journal of Power Sources, 2001, pp. 113-120, vol. 96, U.S. (8 pages).

Plett et al., "Extended Kalman filtering for battery management systems of LiPB-based HEV battery packs Part 3. State and parameter estimation," Journal of Power Sources, 2004, pp. 277-292, vol. 134, U.S. (16 pages).

Plett et al., "Sigma-point Kalman filtering for battery management systems of LiPB-based HEV battery packs Part 2: Simultaneous state and parameter estimation," Journal of Power Sources, 2006, pp. 1369-1384, vol. 161, U.S. (16 pages).

Roscher et al., "Dynamic electric behavior and open-circuit-voltage modeling of LiFePO4-based lithium ion secondary batteries," Journal of Power Sources, 2011, pp. 331-336, vol. 196, Germany (6 pages).

International Search Report and Written Opinion for Corresponding Application (i.e., PCT/US2013/041362), dated Sep. 16, 2013 (9 pages).

International Search Report corresponding to International Patent Application No. PCT/EP2018/069230 (5 pages).

METHOD AND SYSTEM FOR ESTIMATING BATTERY OPEN CELL VOLTAGE, STATE OF CHARGE, AND STATE OF HEALTH DURING OPERATION OF THE BATTERY

FIELD

This disclosure relates generally to the field of battery management systems and, more specifically, to methods and systems for estimating open cell voltage, state of charge, and state of health characteristics of a battery while the battery is connected to a load during operation.

BACKGROUND

Battery systems are widespread and provide energy storage to power a wide range of devices, electric vehicles, and energy storage for use as backup power systems during electrical grid failures or as energy storage systems that store excess power from wind, solar, and other electrical power generation systems for later use. Monitoring various characteristics of the battery while the battery operates is important to ensuring that the battery can provide electrical energy as needed for various applications and to ensure that the battery is not damaged or unduly degraded during operation.

One challenge that occurs in monitoring batteries is that some types of battery measurements can only be performed with great accuracy when the battery is disconnected from an electrical load to enable the battery to reach a quiescent state. For example, one well-known parameter of a battery that changes over time as the battery charges and discharges is known as the open cell voltage (OCV). As used herein, the term "open cell voltage" refers to the voltage level that is measured across an anode terminal and a cathode terminal of the battery when the battery is disconnected from any load for a sufficient time to return to a quiescent state, where the sufficient time is typically on the order of several seconds to several minutes depending upon the battery configuration. When the battery is in the quiescent state, the OCV can of course be measured directly using a simple voltmeter as is known to the art.

However, the OCV cannot be measured using a direct voltage measurement when the battery is connected to a load during operation in which the battery produces a substantial amount of current to drive a load. The OCV of the battery, which changes as the battery charges and discharges during operation, is one characteristic that is used to determine the state of charge (SoC) and state of health (SoH) of a battery during operation of the battery. The state of charge (SoC) is defined as the ratio between the residual charge and the total available charge and state of health (SoH) is defined as the available capacity of the battery between two specified voltage limits. If the OCV of the battery cannot be determined accurately, then the inaccurate OCV value can reduce the accuracy of estimating the state of charge and state of health in the battery. To name just one negative impact of inaccurate battery characteristic determination in a practical setting, an electric vehicle may be unable to produce an accurate estimate of a remaining driving range during operation if any of the OCV, SoC, and SoH of the battery cannot be determined accurately. Consequently, improvements to methods for estimating the OCV and other battery characteristics that are related to the OCV while a battery remains connected to a load would be beneficial.

SUMMARY

In one embodiment, a method for monitoring a battery while the battery is connected to a load for estimating at least one of battery open cell voltage, state of charge, and state of health has been developed. The method includes measuring, with a current sensor, a first current level flowing through the battery to the load at a first time, measuring, with a voltage sensor, a first voltage level between a first terminal and a second terminal of the battery that are each connected to the load at the first time, generating, with a controller operatively connected to the current sensor and the voltage sensor, a first estimated open cell voltage (OCV) of the battery at the first time based on the first current level, the first voltage level, and a predetermined model of the battery stored in a memory operatively connected to the controller, identifying, with the controller, a first excitation level of the battery at the first time based on the first voltage level, the first current level and a cost optimization process, and identifying, with the controller, at least one of a first state of charge (SoC) and a state of health (SoH) of the battery using the first estimated OCV only in response to the first excitation level being below a predetermined threshold.

In another embodiment, a battery management system that monitors a battery while the battery is connected to a load to enable accurate estimation of at least one of battery open cell voltage, state of charge, and state of health has been developed. The battery management system includes a memory and a controller configured to be operatively connected to a current sensor that measures a current flow through a battery to a load, a voltage sensor that measures a voltage level between a first terminal and a second terminal of the battery that are each connected to the load, and the memory. The controller is configured to receive a measurement of a first current level flowing through the battery to the load at a first time from the current sensor, receive a measurement of a first voltage level between the first terminal and the second terminal of the battery that are each connected to the load at the first time from the voltage sensor, generate a first estimated open cell voltage (OCV) of the battery at the first time based on the first current level, the first voltage level, and a predetermined model of the battery stored in the memory, identify a first excitation level of the battery at the first time based on the first voltage level, the first current level and a cost optimization process, and identify at least one of a first state of charge (SoC) and a state of health (SoH) of the battery using the first estimated OCV only in response to the first excitation level being below a predetermined threshold.

DETAILED DESCRIPTION

Figure 1:
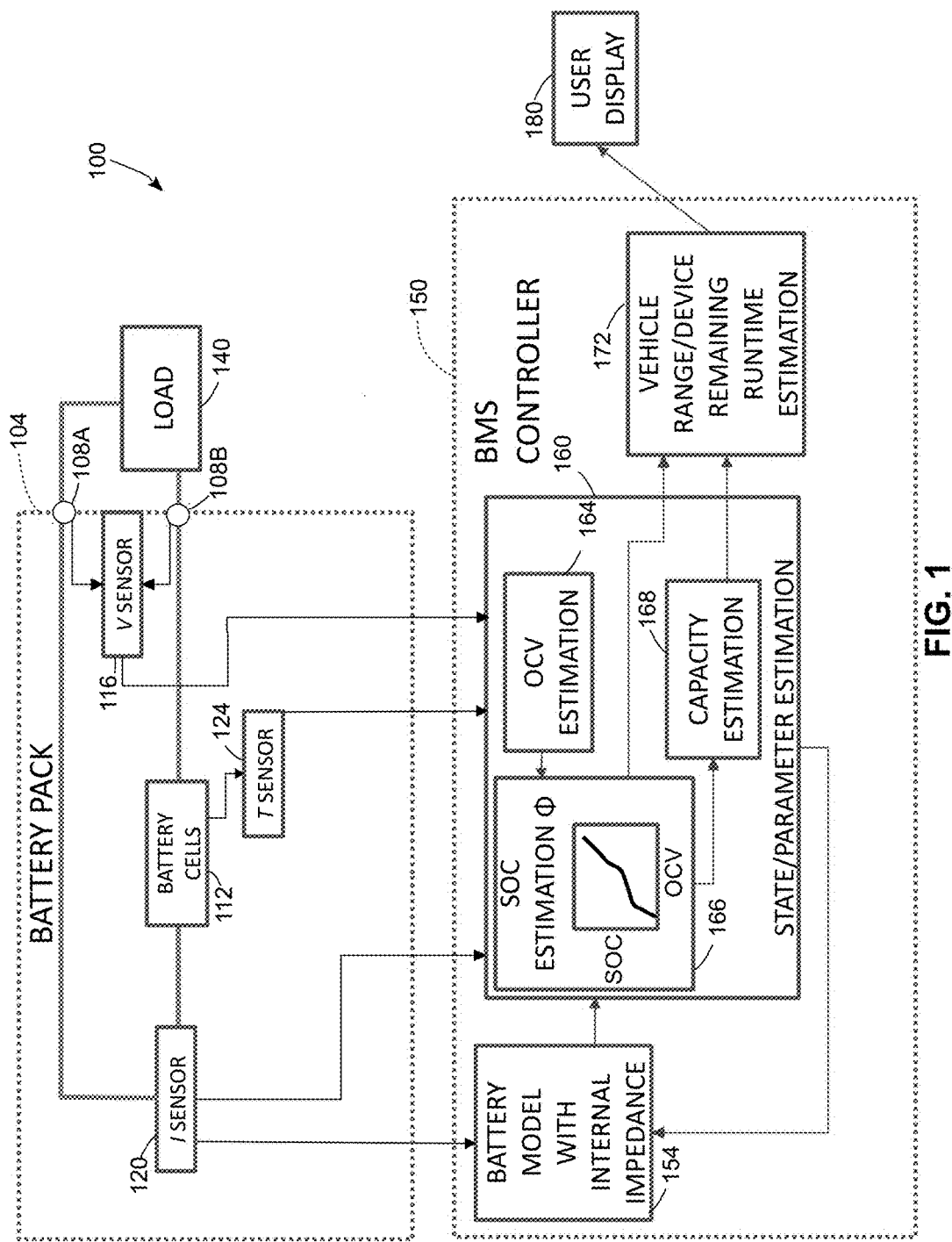
FIG. 1 is a schematic diagram of a system including a battery pack and battery management system that monitors the battery pack while the battery pack is connected to a load.

For the purposes of promoting an understanding of the principles of the embodiments disclosed herein, reference is now be made to the drawings and descriptions in the following written specification. No limitation to the scope of the subject matter is intended by the references. The present disclosure also includes any alterations and modifications to the illustrated embodiments and includes further applications of the principles of the disclosed embodiments as would normally occur to one skilled in the art to which this disclosure pertains.

As used herein, the term "battery" refers to an electrochemical energy storage device that provides electrical power to drive a load that operates using electrical energy. Examples of battery types include, but are not limited to, different forms of lithium-ion, lithium-polymer, nickel metal hydride, lead acid, and flow batteries. In many instances, multiple battery cells constitute a larger battery. Each individual battery cell includes all of the structural elements (e.g. anode, cathode, and electrolyte) of a battery, but in many practical embodiments multiple battery cells are connected together with, for example, series, parallel, and series-parallel electrical connections to form a larger battery that has sufficient energy storage and power delivery capabilities to be used in a practical device. Consequently, any reference to a battery herein is applicable to individual battery cells and larger batteries that are formed from multiple battery cells. The term "battery pack" refers to practical embodiment of a battery that includes at least one battery cell and optionally additional sensor and control devices that are connected to the at least one battery cell. The term "battery management system" refers to an electronic control device that monitors the status of a battery using sensor data collected from the battery and, in some embodiments, models of the battery that enable the battery management system to estimate characteristics of the battery during operation.

Examples of loads that receive electrical power from a battery include, but are not limited to, electronic circuits and digital computing devices, electrical motors, and electrical heating devices. One non-limiting example of a load that is used herein for illustrative purposes is an electric vehicle that typically includes at least one electrical drive motor as well as multiple secondary electrical motors (e.g. for power steering, windshield wipers, brakes, mirrors, windows, and for heating/cooling) along with various lights and analog and digital electronic devices. In "secondary battery" embodiments, which are also referred to as "rechargeable" batteries, certain types of loads provide electrical power to the battery to perform a recharging process. Loads that generate electrical power include, for example, any alternating current (AC) electrical power generation system (e.g. an alternator, generator, flywheel, standard power grid connection, and the like) that is combined with transformers and rectifiers as known to the art to produce a DC charging current or any direct current (DC) electrical power source (e.g. another battery, charged capacitor, photovoltaic array, and the like) with appropriate voltage regulation circuitry to produce a charging current for the battery.

As used herein, the term "state of health" (SoH) refers to the available capacity of the battery between two specified voltage limits such as a maximum operating voltage when the battery is fully charged and a minimum operating voltage at which point the battery is considered to be discharged for operational purposes. Those of skill in the art will recognize that the SoH characteristic of a battery refers to a practical operational charge capacity between maximum and minimum voltage limit levels that enable long-term operation of the battery. The SoH does not necessarily correspond to the absolute maximum and minimum charge levels that are physically possible in the battery because overcharging and undercharging to the physical limits of the battery often results in shortened battery lifespan and damage to the battery. The SoH of a battery changes over time as the battery ages during use, with the SoH of most practical batteries experiencing a long-term decline over the life of the battery. However, during short-term operation the SoH value can increase or decrease based on various environmental factors and the usage pattern of the battery. The SoH characteristic is often referenced in units of energy, such as joules, watt-hours, or any other suitable energy unit, but those of skill in the art also often refer to SoH in units of amp-hours or other units of current and time since the battery is assumed to operate at some nominal voltage level. In another embodiment, the SoH characteristic is described using a percentage value in which a 100% SoH corresponds to the total available capacity of the battery at time of manufacture and the SoH of the battery gradually reduces to lower percentage values during the life of the battery.

As used herein, the term "state of charge" (SoC) refers to a ratio of the amount of charge that is stored in a battery at a given point during operation to a total charge that can be stored in the battery at a full charge level using the upper voltage limit for the SoH. The SoC changes as the battery is discharged and charged during operation. In some embodiments, the SoC is also expressed as a fraction or percentage of the SoH for the battery since the SoC of a fully-charged battery is equal to the total SoH for the battery and the SoC decreases as the battery discharges.

FIG. 1 is a schematic diagram of a battery system 100 that monitors the OCV and optionally SoC and SoH of a battery connected to a load. The battery system 100 includes a battery pack 104 that provides electrical power to a load 140, a battery management system (BMS) controller 150, which is also referred to as the "controller" 150 herein, and a user display device 180. While FIG. 1 depicts the battery pack 104 and the battery management system 150 as separate elements, in some embodiments the BMS is physically integrated into the battery pack while in other embodiments a BMS is connected to one or more battery packs via a digital communication channel such as a controller area network (CAN) bus, universal serial bus, Ethernet, or any other suitable digital communication channel.

The battery pack 104 includes electrical terminals 108A and 108B, one or more battery cells 112, a voltage sensor 116, a current sensor 120, and a temperature sensor 124. The terminals 108A and 108B are electrically connected the battery cells 112 and the battery pack 104 is electrically connected to a load 140 via the terminals 108A and 108B to enable the battery pack 104 to provide electrical power to the load 140. While FIG. 1 depicts a load 140 that receives electrical power from the battery cells 112 in the battery pack 104, those of skill in the art will also recognize that in some configurations the load 140 is replaced with an electrical power source that provides electrical power to the battery pack 104 to charge the battery cells 112.

In the battery pack 104, the voltage sensor 116 measures a voltage potential of all of the battery cells 112, which is depicted with a connection of the voltage sensor 116 to the terminals 108A and 108B of the battery pack 104 in FIG. 1. If the battery pack 104 is disconnected from any load and allowed to return to a quiescent state then the voltage sensor 116 can measure the OCV of the battery cells 112 directly. However, during operation of the battery pack 104 to supply electrical current to the load 140, the voltage sensor 116 does not measure the OCV of the battery cells 112. The voltage sensor 116 does, however, produce voltage measurements that the controller 150 uses in conjunction with other sensor data to generate estimates of the OCV for the battery 112 cells as is further described below.

In the battery pack 104, the current sensor 120 measures a flow of electrical current through all of the battery cells 112. The current sensor 120 is depicted as an ammeter that is connected in series with the battery cells 112 for illustrative purposes, but those of skill in the art will recognize that a shunt resistor, current clamp ammeter, or any other suitable indirect current sensing device is also suitable for use with the battery pack 104. The temperature sensor 124 is a thermocouple, thermistor, or any other suitable temperature probe that is physically affixed to the battery cells 112 to generate measurements of the temperature of the battery cells 112 during operation. In some embodiments the temperature sensor 124 further includes multiple temperature sensing elements that measure the temperatures of different battery cells within a larger array of battery cells in larger battery pack configurations where the battery cells 112 may not have uniform temperatures.

The controller 150 includes at least one digital logic device and at least one memory device. The controller 150 is operatively connected to the battery pack 104 and receives sensor data from the voltage sensor 116, the current sensor 120, and the temperature sensor 124. In the system 100, the controller 150 is implemented using at least one microprocessor, microcontroller, field programmable gate array (FPGA), digital signal processor (DSP), application specific integrated circuit (ASIC), or other suitable digital logic devices. The controller 150 optionally includes analog to digital converters (ADCs) in embodiments where one or more of the sensors 116-124 generate analog sensing signals to enable the controller 150 to process digital representations of the analog sensor signals, although in other embodiments the sensors include ADC circuits that produce digital output data directly. The memory in the controller 150 includes both a volatile data storage device such as a static or dynamic random access memory (RAM) and a non-volatile memory such as NOR and NAND flash or a magnetic disc that stores long-term data such as system software/firmware stored program instructions and default parameters for a battery model and other battery characteristics that are described below.

The controller 150 executes stored program instructions in the memory to implement a battery model 154, battery state and parameter estimation logic 160, and vehicle range or device remaining runtime logic 172. The battery model 154 includes stored parameters for an equivalent circuit or electrochemical model that approximates the internal state of the battery cells 112. The state and parameter estimation logic 160 uses the battery model 154 and input data from the voltage sensor 116, current sensor 120, and the temperature sensor 124 to generate estimates for the OCV with the OCV estimator 164, the SoC with the SoC estimator 166, and the SoH with the capacity estimator 168. The vehicle range or device remaining runtime estimator 172 enables the controller 150 to use the estimated SoC and SoH characteristics of the battery cells 112 in the battery pack 104 in conjunction with the past, present, and predicted future power consumption characteristics of the load 140 to generate an estimate of the remaining useful capacity of the battery to drive the load. For example, in an electric vehicle the range estimator 172 provides an estimate of the remaining driving range of the vehicle before the battery pack 104 needs to be recharged. In a smartphone or other mobile electronic device, the runtime estimator 172 provides an estimate of how much longer the device may operate until the battery pack 104 needs to be recharged. The BMS controller 150 is also connected to a user display device 180 which is, for example, an LCD display or an audio output device that generates an output based on the estimated OCV, SoC, and SoH of the battery cells 112 or an output corresponding to the estimated remaining vehicle range or device runtime.

Figure 3:
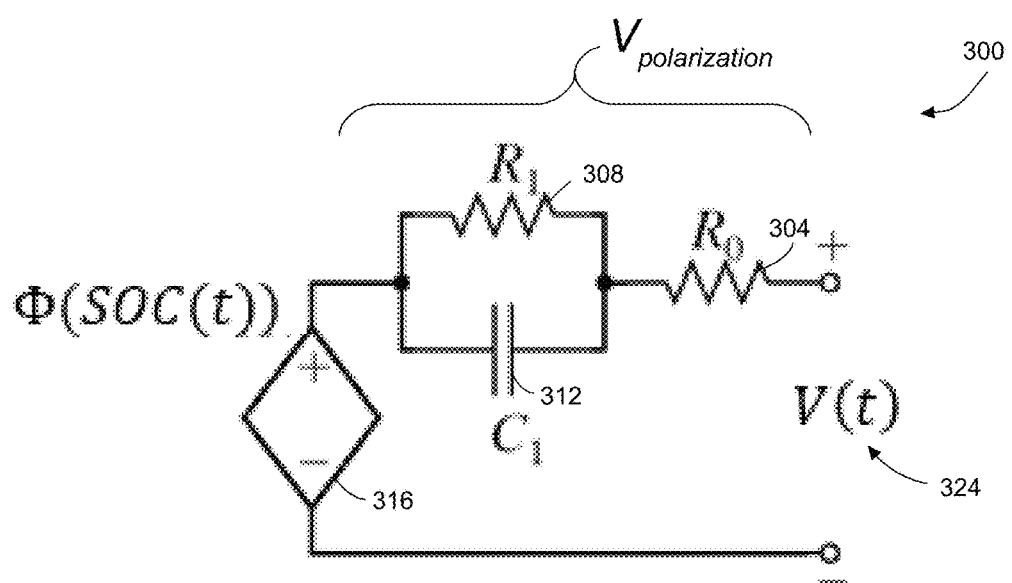
FIG. 3 is a schematic diagram of an equivalent circuit used in a battery model in the system of FIG. 1.

FIG. 3 depicts one embodiment of a battery model 300. The battery model 300 is defined as an equivalent circuit that has the electrical properties of the battery cells 112, including internal impedance and capacitance properties of the battery cells 112. The equivalent circuit 300 includes a resistance $R_0$ (304) that is connected in series with a parallel connected combination of another resistance $R_1$ (308) and a capacitance $C_1$ (312). The equivalent circuit 300 also includes a variable voltage source 316 that represents the voltage level that the battery produces at different SoC levels. Hence, the output voltage of the voltage source 316 is represented by a function $\Phi$ where the output of $\Phi$ is a voltage level that depends on the SoC at a time t during operation of the battery. As the SoC decreases during discharge or increases during a charge cycle, the voltage level of the voltage source 316 changes accordingly. In the BMS 150, the function $\Phi$ is embodied as a lookup table or other curve in the SoC estimator 166 for use in determining an estimate of SoC after the system 100 has generated an accurate estimate of the OCV. The function $\Phi$ is a mapping between OCV and SoC is determined empirically by testing $\Phi$ the voltage levels of the battery cells 112 at various SoC levels at the time of manufacture of the battery 112 and in some embodiments the mapping between OCV and SoC changes gradually over the lifetime of the battery pack 104, although during the timeframe of the process 200 the mapping remains fixed. The voltage V(t) (324) represents the total output voltage of the battery that varies over time based on the voltage level of the voltage source 316 and the changes in voltage that occur due to the current flow through the resistors $R_0$, $R_1$ and the effects of the capacitor $C_1$. In a quiescent state in which no electrical current flows through the battery, the output voltage V(t) 324 is equal to the voltage level of the voltage source 316 based on the current SoC of the battery using the predetermined function $\Phi$ (SoC(t)). However, during operation of the battery the flow of current introduces another voltage value based on the change in voltage that is produced by the series-parallel combination of $R_0$, $R_1$, and $C_1$, which is also referred to as the polarization voltage $V_{polarization}$ while the remaining component of the output voltage V(t) is produced by the voltage source 316. As described in more detail below, the controller 150 uses the battery model 154 to identify estimated OCV values for the actual battery cells 112 while the battery cells 112 provide current to the load 140.

Figure 2:
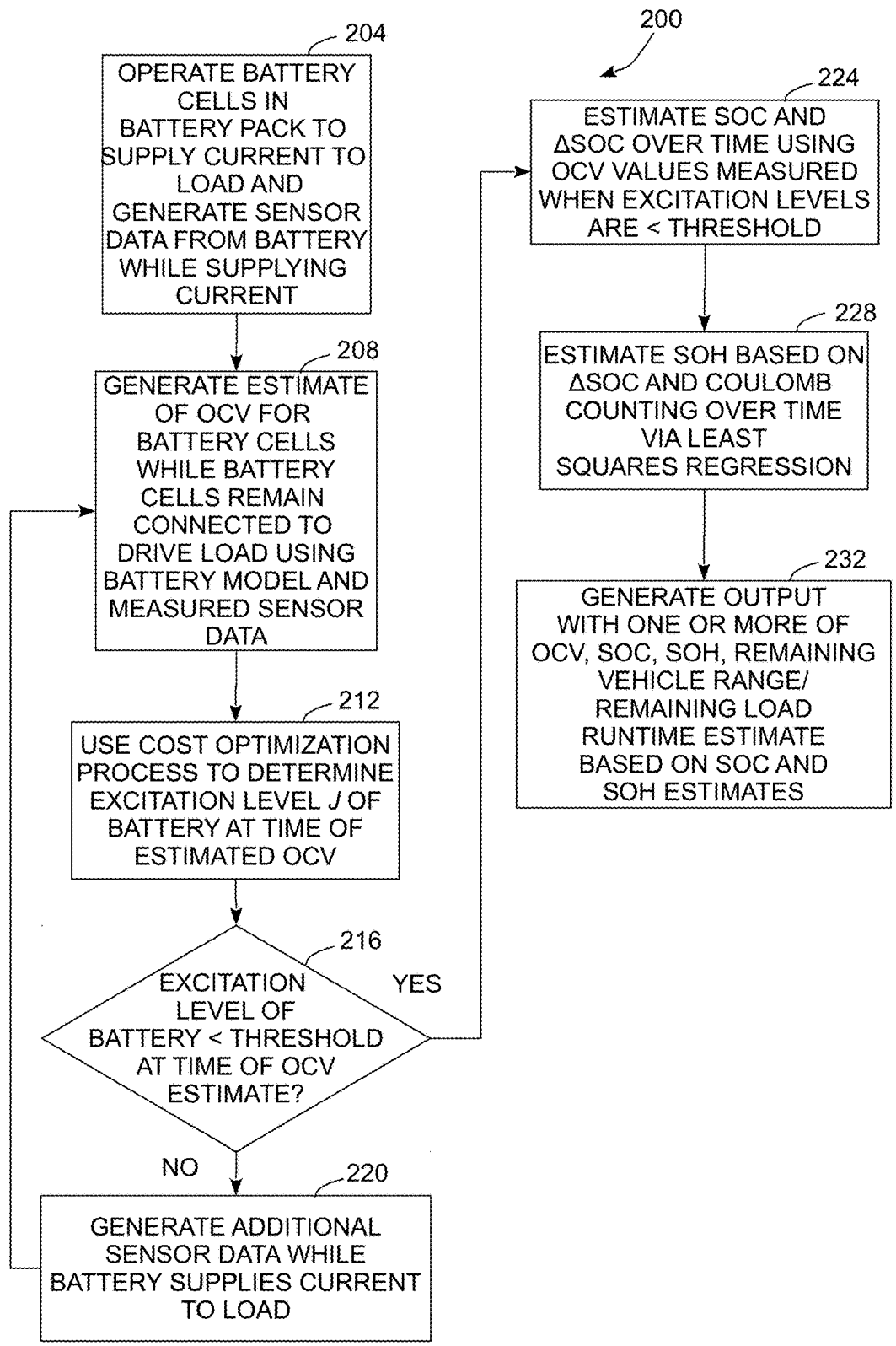
FIG. 2 is a block diagram of a process for estimating battery characteristics including at least the open cell voltage of the battery during operation while the battery remains connected to a load.

FIG. 2 depicts a process 200 for monitoring a battery while the battery is connected to a load to enable the estimation of battery characteristics including at least the OCV and optionally the SoC and SoH in the battery without having to disconnect the battery from the load. In the description below, a reference to the process 200 performing a function or action refers to the operation of a controller, such as the controller 150 in the system 100, to execute stored program instructions to perform the function or action in conjunction with other components in the battery management system and battery pack.

Process 200 begins as the battery pack 104 provides electrical current to drive the load 140 and the controller 150 receives sensor data including measurements of the voltage level across the terminals 108A and 108B from the voltage sensor 116, the current level flowing through the battery pack 104 to the load from the current sensor 120, and temperature level data for the battery cells 112 from the temperature sensor 124 (block 204). While FIG. 2 depicts the block 204 at the beginning of the block diagram, the controller 150 continues to receive the sensor data from the sensors in the battery pack 104 at regular intervals throughout the operation of the battery pack 104.

The process 200 continues as the controller 150 uses the measured voltage level from the voltage sensor 116 (V(t)) and measured current level data from the current sensor (I(t)) at a particular time t to generate an initial estimate of the OCV for the battery 112 based on the battery model 154 that includes the resistance values $R_0$ and $R_1$ and the capacitance value $C_1$ described above. For example, in the battery model 154 the output voltage V(t) is provided by the following equations, where $I_1$ is the current through the resistance $R_1$:

$$\dot{I}_1(t) = \frac{I(t) - I_1(t)}{R_1 C_1}$$

$$V(t) = \Phi(SOC(t)) + I(t)R_0 + I_1(t)R_1$$

In the preceding equation, $\phi$ (SOC(t)) provides the voltage of the voltage source 316 based on the function $\Phi$ and the SoC at time t. The terms $I(t)R_0 + I_1(t)R_1$ correspond to $V_{polarization}$ since these terms represent the combined voltage drops across the resistors $R_0$ and $R_1$ in the equivalent circuit 300 as current flows through the circuit and represent the deviation of the battery terminal voltage from the steady state voltage. The controller 150 uses the OCV estimator 164 to generate an estimate of OCV based on the measured value of V(t) and values of I(t) and $I_1(t)$, along with predetermined resistance values of $R_0$, $R_1$ and the capacitance value $C_1$ from the battery model 154 to generate an estimated OCV value: $\hat{V}_{OCV}(t) = V(t) - (I(t)R_0 + I_1(t)R_1)$. The controller 150 uses the battery model parameters $(R_0, R_1, C_1)$, which correspond to the internal impedance of the actual battery cells 112, to generate an accurate estimate of the OCV of the battery cells 112. The estimation of the impedance parameters relies first on a reformulation of the equivalent circuit model dynamics in to an input output model where the output depends linearly on the impedance parameters. Regression techniques can then be applied to this input output model to estimate the impedance parameters.

The controller 150 identifies the values of V(t) and $(I(t)R_0 + I_1(t)R_1)$ directly from the sensor data and the resistance values in the equivalent circuit 300 of the battery model 154 to identify the estimated OCV: $\hat{V}_{OCV}(t)$. As is known in the art, the "^" notation indicates that a value in an equation is an estimate rather than a value that is determined directly from sensor input or other precise values. While an estimate of OCV can be obtained simply from the mapping $\Phi$ and an estimate of SoC, this direct approach leads to inaccurate capacity estimation as the error in SoC estimation propagates to the capacity estimation. Since errors in capacity estimation significantly affect the SoC estimation, this effect propagates further and could result in poor estimation of the battery capacity. The effect of such errors prorogating is mitigated by not using the estimated SoC as a part of the capacity estimation (SoH) procedure. Instead, a mechanism is developed to identify when a rest voltage or open circuit voltage (OCV) approximation derived from the battery voltage measurement $V_{measured}$ and polarization $V_{polarization}$ from a battery model is accurate.

In some instances, the estimated OCV $\hat{V}_{OCV}(t)$ may be inaccurate since the value is determined using the equivalent battery model 154 that may not fully account for all possible transient current and voltage values that are measured during operation of the battery pack 104. If the actual battery cells 112 have a high excitation level at the time that the OCV is estimated using the battery model 154, then the estimated OCV may be inaccurate even if the battery model 154 would provide an accurate estimate of OCV when the battery cells 112 are operating in a steady state with a low excitation level. Process 200 continues as the controller 150 uses a cost optimization process to determine an excitation level J of the battery cells 112 at or around the time that the OCV was estimated during the operation of the battery pack 104 (block 212).

Figure 4:
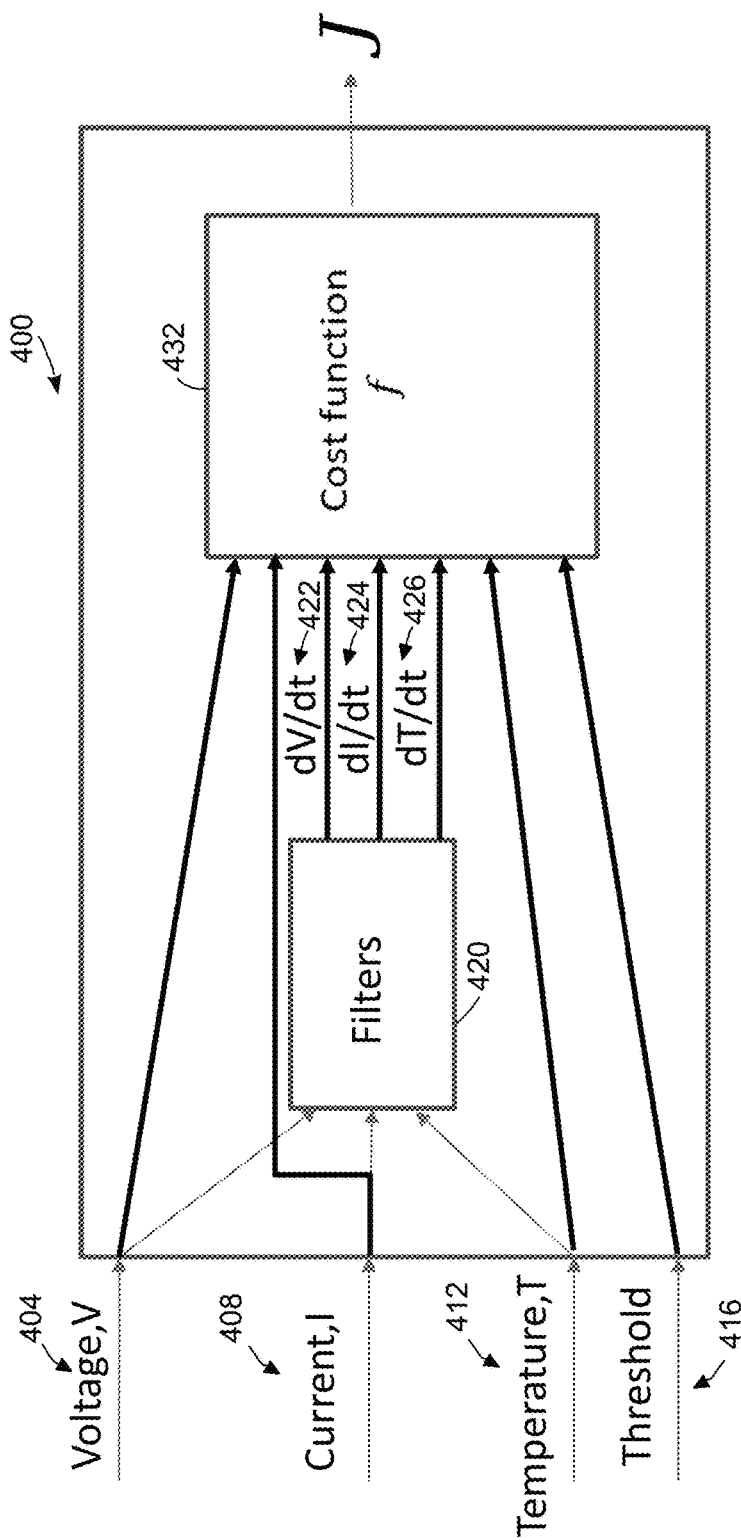
FIG. 4 is a schematic diagram of a cost optimization process that is implemented in the system 100 to determine the excitation level of the battery over time while the battery remains connected to a load.

FIG. 4 is a graphical depiction of the cost optimization process 400 in more detail. In the system 100 the controller 150 executes the cost optimization process 400 using stored program instructions in the OCV estimator 164 using input sensor data from the battery pack 104. In FIG. 4, the cost optimization process 400 receives as inputs multiple samples of sensor data from each of the sensors in the battery pack 104 including the measured battery voltage V(t) 404 from the voltage sensor 116, measured current I(t) from the current sensor 120, and measured temperature data T(t) 412 from the temperature sensor 124.

In addition to receiving the sensor data directly, the optimization process 400 also implements filters 420 that produce measurements of the changes in the voltage, current, and temperature sensor data over time, which are expressed mathematically as the derivatives of voltage $$\left(\frac{dV}{dt}\right) 422,$$

current $$\left(\frac{dI}{dt}\right) 424,$$

and temperature $$\left(\frac{dT}{dt}\right) 426$$

with respect to time t. In one practical embodiment the filters 420 generate the derivatives by performing a linear curve-fitting process through a plurality of sensor data samples that are received over a predetermined time period (e.g. a time span of 30 seconds). The controller 150 identifies the slopes of the fitted curves as the instantaneous rate of change of each sensor value at the measurement time t, which are expressed as the derivatives of voltage $\left(\frac{dV}{dt}\right)$ 422, current $\left(\frac{dI}{dt}\right)$ 424, and temperature $\left(\frac{dT}{dt}\right)$ 426 in FIG. 4. The filters 420 use averaging of multiple sensor values over time and filter implementations with appropriately tuned filter cutoff parameters including, for example, a series of Chebyshev or Butterworth filters that are known to the art to reduce or eliminate the effects of random noise that occurs in individual sensor data samples when determining the rates of change for the voltage, current, and temperature data.

The cost optimization process 400 also receives predetermined threshold values $\in_1, \in_2, \in_3, \in_4$ 416 that correspond to thresholds for the current input I(t) 408, current derivative $\left(\frac{dI}{dt}\right)$ 424, voltage derivative $\left(\frac{dV}{dt}\right)$ 422, and temperature derivative $\left(\frac{dT}{dt}\right)$ 426, respectively. The cost optimization process 400 implements a cost function 432 that generates a measurement of the excitation level J of the battery cells 412 that minimizes an error (cost) between the excitation level J and the observed input data given the predetermined threshold values 416. Expressed mathematically, the cost function 432 is:

$$J(t) = f\left(I(t), \frac{dI}{dt}, \frac{dV}{dt}, \frac{dT}{dt}, \in_1, \in_2, \in_3, \in_4\right)$$

To generate an estimate of J, the cost function 432 produces a four element vector based on the quotients of the measured current I(t) and the derivatives of current, voltage, and temperature divided by the predetermined thresholds:

$$\hat{f} = \left[\frac{|I(t)|}{\in_1}, \frac{\left|\frac{dI}{dt}\right|}{\in_2}, \frac{\left|\frac{dV}{dt}\right|}{\in_3}, \frac{\left|\frac{dT}{dt}\right|}{\in_4}\right].$$

The optimization process 400 then normalizes the vector by, for example, identifying the total magnitude of the vector based on all four of the individual elements with f=norm($\hat{f}$) or identifying the worst case cost with f=max($\hat{f}$) where max is a maximization function can be utilized produce the final excitation level J. The output of the cost function 432 is a battery excitation level parameter J corresponding to the battery cells 112 in the battery pack 104 at the same time t that the process 200 generates the estimate of the OCV, although those of skill in the art will recognize that in a practical embodiment the OCV estimate and the battery excitation level estimate can be generated within a predetermined time window (e.g. within a span of 5 seconds of operation of the battery pack 104) and need not both correspond to a single instant in time.

During process 200, the controller 150 generates the estimates of OCV and the battery excitation level Jas described with reference to blocks 208 and 212 in any order or concurrently. The battery excitation level J is a signal that the controller 150 measures to identify a deviation of the battery from a steady state condition. When the cost J(t)=0 during a time window, the controller 150 uses the zero cost to indirectly identify that the battery cells 112 are not experiencing concentration gradients or thermal gradients that produce transient conditions in the battery cells 112 that could lead to errors in estimating the OCV using the predetermined battery model 154. Consequently the magnitude of J at any time indicates a distance of the battery state to this equilibrium condition. Furthermore, the predetermined threshold values $\in_1, \in_2, \in_3, \in_4$ enable the controller 150 to identify pseudo-equilibrium scenarios when the estimate of the OCV of the battery obtained from an equivalent circuit model is accurate even if the battery is not completely at equilibrium.

Referring again to FIG. 2, during the process 200 if the excitation level of the battery cells 112 in the battery pack 104 is greater than a predetermined threshold at the time that the controller 150 generated the estimated OCV of the battery (block 216) then the controller 150 does not use the estimated OCV in any further processing since the excitation level of the battery means the OCV estimate has high likelihood of being inaccurate. The process 200 continues as the sensors in the battery pack 104 generate additional sensor data while the battery pack 104 provides electrical current to drive the load 140 (block 220) and the controller 150 repeats the processing that is described above with reference to blocks 208-216 until the controller 150 determines an estimated OCV for the battery pack 104 that occurs while the excitation level J of the battery pack 104 is below the predetermined threshold to ensure that the estimated OCV has sufficient accuracy to be used in generating further estimates of the SoC and SoH of the battery.

While the FIG. 2 depicts a single iterative process to determine an estimate of the OCV for illustrative purposes, the controller 150 in the embodiment of FIG. 1 can continue to perform the OCV estimation process continuously during operation of the battery pack 104 to produce updated estimates for the OCV of the battery pack 104 at different times during operation of the system 100. As described in further detail below, the controller 150 generates multiple SoC estimates for the battery at different times during operation, and the controller 150 continues to generate OCV estimates at the different times to enable more accurate generation of the SoC estimates.

The process 200 continues as the system 100 identifies an estimated SoC of the battery cells 112 in the battery pack 104 at time t (block 224). The controller 150 uses the estimated value of the OCV at time t and the predetermined mapping SOC(t)=Φ($\overline{OCV}$(t)) in the SoC estimator 166 to generate the estimated SoC based on the estimated OCV at time t that the controller 150 has identified to have acceptable accuracy based on the excitation level of the battery cells 112. The controller 150 stores multiple SoC estimates that are generated at different times t using the estimated OCV values at the different times t in the memory to track the changes in SoC levels in the battery pack 104 as the battery cells 112 deliver power to the load 140. During the process 200, the controller 150 also identifies the ΔSoC, which refers to the change in the SoC level that occurs over time, such as the change in SoC from a first time $t_1$ to a second time $t_2$ although the ΔSoC can also refer to changes of the SoC over three or more different points in time.

During process 200, the controller 150 optionally uses the measured changes ΔSoC and measurements of the current flow through the battery over time during operation of the battery pack 104 to generate estimates of the SoH of the battery cells 112 while the battery pack 104 drives the load 140 (block 228). To estimate the SoH, the controller 150 uses the capacity estimator 168 to combine multiple measurements of changes in the SoC over time with a process that is referred to as "Coulomb counting" referring to the total amount of charge that the battery pack 104 delivers to the load 140 over time to estimate the total capacity of the battery cells 112 at different times. The Coulomb counting process measures accumulated charge based on the following equation:

$$\text{Accumulated Charge} = \int_{t_1}^{t_2} I(\tau) d\tau.$$

In the embodiment of FIG. 1, the controller 150 identifies the accumulated charge by summing the current level measurement values that are received from the current sensor 120 between the times $t_1$ to $t_2$ to identify the accumulated charge as a value in units of Coulombs or an equivalent charge unit. As is well known in the art, the current measurement values, which are often expressed using Amps as a unit, refer to the rate at which charge moves in a circuit. The controller 150 sums the rate measurements over time to implement a numeric integration process that identifies the total accumulated charge over the time span from $t_1$ to $t_2$.

The SoH is related to ΔSoC and the accumulated charge based on the following equation:

$$\Delta SoC = SoC(t_2) - SoC(t_1) = \frac{1}{SoH} * \int_{t_1}^{t_2} I(\tau) d\tau$$

The equation above solved for SoH provides:

$$SoH = \frac{1}{\Delta SoC} * \int_{t_1}^{t_2} I(\tau) d\tau$$

The above equation can be rewritten in an input output format with the output y representing the accumulated charge and the input x represents the change in SoC. The parameter θ represents the SoH of the battery.

$$\text{Accumulated Charge} = SoH * (\Delta SoC) \quad y = \theta x.$$

The SoH estimation process generally requires multiple sets of ΔSoC and accumulated charge data to produce accurate estimates of the battery SoH. The capacity estimator 168 in the controller 150 estimates the parameter θ using one or more of a Least squares method, Extended Kalman Filter, Moving Horizon Estimator or Recursive Least Square (RLS) method. One embodiment using RLS is explained below for illustrative purposes. The Recursive Least Square algorithm (RLS) algorithm accesses a buffer of previously stored estimate data in the memory to estimate the capacity based on the previous estimate available, two or more SoC value estimates over time, and accumulated charge. The evolution of the RLS algorithm based parameter estimate with measurements available after each sampling duration is as follows, as is known to those skilled in the art $$P_k = \frac{1}{\alpha_{\{k-1\}}} \left( P_{\{k-1\}} - \frac{P_{\{k-1\}}^2 x_k^2}{\alpha_{\{k-1\}} + x_{\{k\}}^2 P_{\{k-1\}}} \right)$$

$$\theta_{\{k\}} = \theta_{\{k-1\}} + \frac{P_{\{k-1\}} x_k (y_k - \theta_{\{k-1\}} x_k)}{\alpha_{\{k-1\}} + x_k^2 P_{\{k-1\}}}$$

where α∈[0,1] is the forgetting factor and $P_0$ is the initial value of the uncertainty matrix. The controller 150 executes stored program instructions to implement the RLS algorithm above or another variation of an SoH estimation process. The process 200 ensures that the controller 150 only generates the OCV events at times when the charge excitation level of the battery is sufficiently low to enable the OCV estimator 164 to produce accurate OCV estimates. Since both the SoC and SoH estimation processes rely upon accurate OCV inputs, the process 200 enables accurate estimations of SoC and SoH while the battery pack 104 remains connected to the load 140 during dynamic operation.

Battery management systems use SoH in a wide range of operations. One operation that benefits from an accurate SoH estimate occurs as the controller 150 to operates the battery pack 104 in situations where the load 140 both receives power from the battery pack and charges the battery pack 104 at different times during operation. Examples of such system configurations include hybrid vehicles or power storage systems where the battery pack 104 receives a charging current and provides a power current at different times during operation.

During the process 200, the system 100 generates an output that includes one or more of the estimated OCV, SoC, and SoH values for the battery cells 112 in the battery pack 104 and optionally additional information related to the battery state such as an estimate of remaining vehicle range or runtime of the load 140 (block 232). In the system 100, the controller 150 generates a visual display including alphanumeric or graphical representations of the battery and device status, or an audible output of the status of the battery cells 112 in the battery pack 104 using the user display device 180. For example, the user display device 180 can display the current estimated OCV as a voltage value, the SoC as a percentage value or a graphical battery level icon, and the SoH as a numeric capacity value or as a percentage of the nominal capacity of the battery pack 104 at time of manufacture. In the system 100, the controller 150 optionally performs additional vehicle range/device remaining runtime estimation 172 that uses the generated information about the battery SoC and SoH in conjunction with a forecast of the energy usage patterns of the load 140 to generate an output that informs the user of, for example, the estimated remaining range of an electric vehicle or an estimated remaining time that a device such as a smartphone or other electronic device may run until the battery reaches a minimum operational charge level. The display device 180 is further configured to produce visual or audible outputs to alert operators to the remaining estimated vehicle range or device runtimes.

In the system 100 of FIG. 1, the controller 150 performs the process 200 continuously while the battery pack 104 is connected to the load 140 to produce continuous updates the estimated OCV and to generate corresponding updates to the SoC and SoH as the OCV changes during the operation of the battery pack 104. The controller 150 then generates updated outputs with the display device 180 or another output device to provide updates to the status of the battery cells 112 and optionally to display the current status and usage history of the battery cells 112.

The embodiments described herein provide technological improvements to devices that use batteries to provide electrical power to various loads. For example, the system 100 of FIG. 1 and the process 200 of FIG. 2 enable accurate estimation of the OCV level of the battery cells 112 while the battery pack 104 remains connected to the load 140 during continuous operation without requiring the battery pack 104 to be disconnected from the load 140 to enable direct measurement of the OCV in the quiescent state. As described above, enabling high accuracy for the estimation of OCV also improves the accuracy of estimation of SoC and SoH to enable the system 100 to accurately monitor the battery pack 104 while the battery pack 104 remains connected to the load 140.

Figure 5:
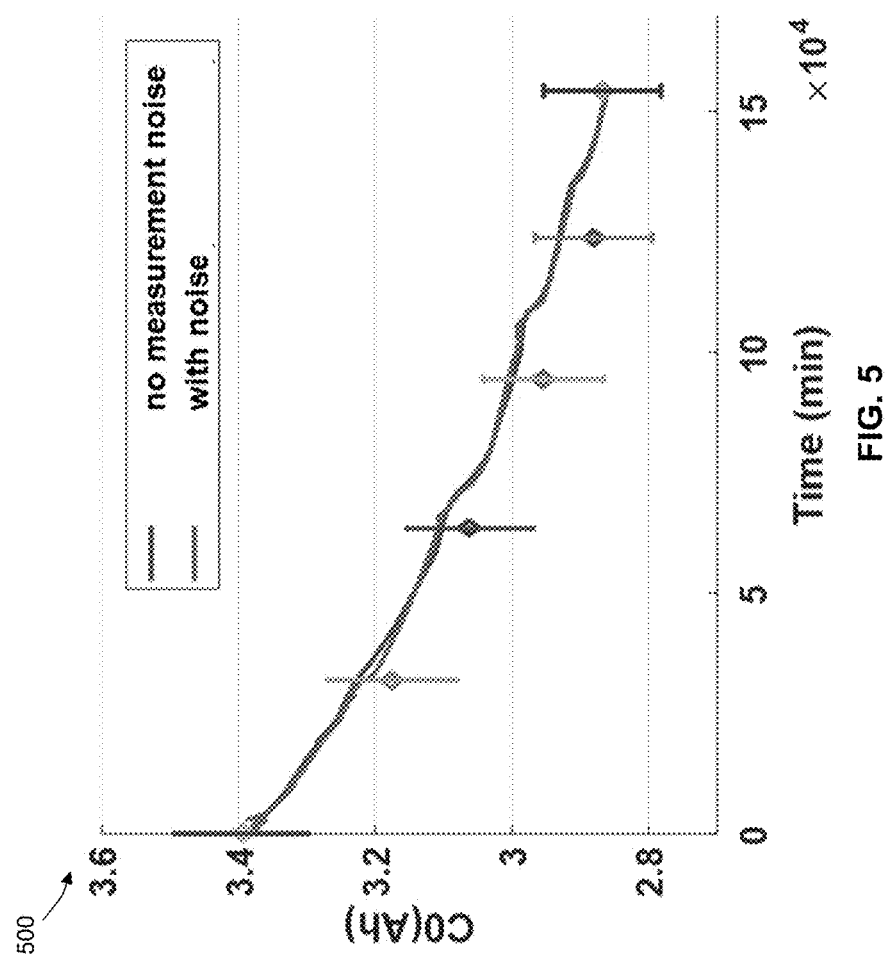
FIG. 5 is a graph depicting estimated battery capacity measurements that are generated using an embodiment of the system of FIG. 1 and the process of FIG. 2.
Figure 6:
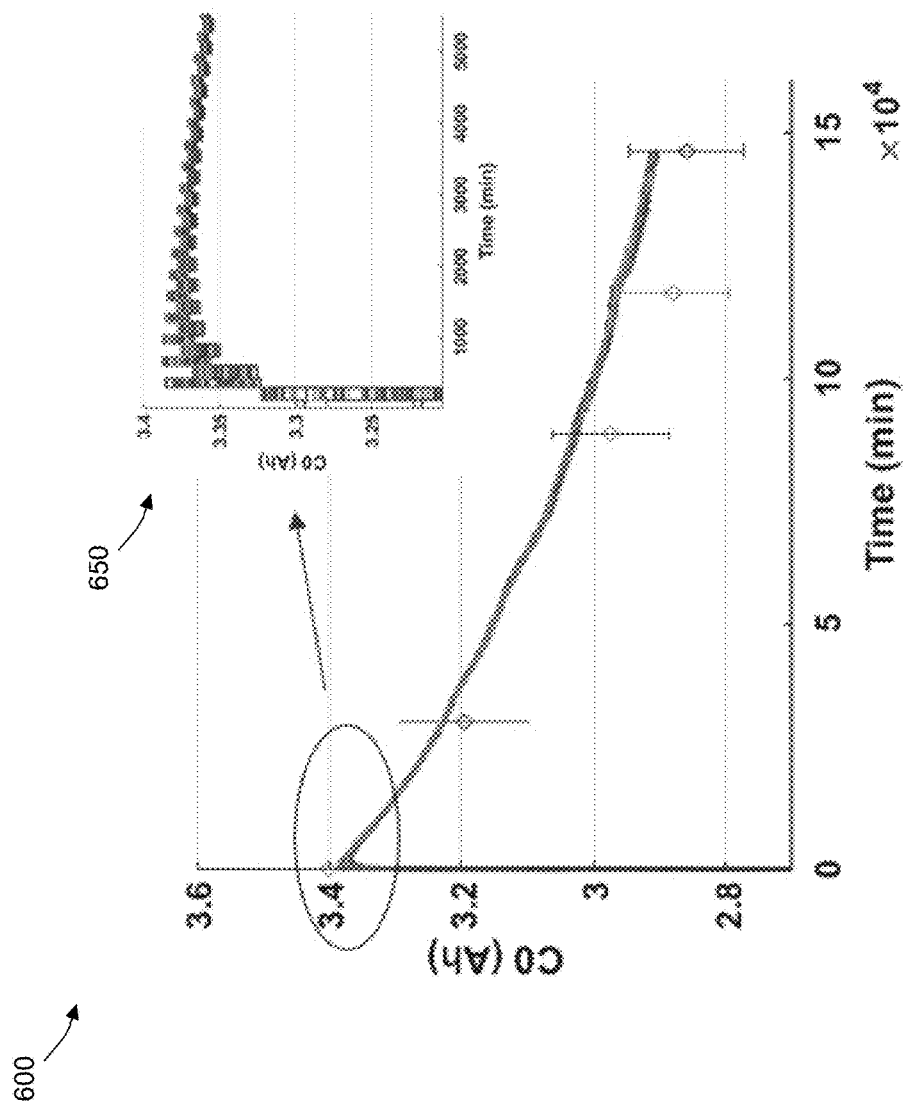
FIG. 6 is another graph depicting estimated battery capacity measurements that are generated using an embodiment of the system of FIG. 1 and the process of FIG. 2.
Figure 7:
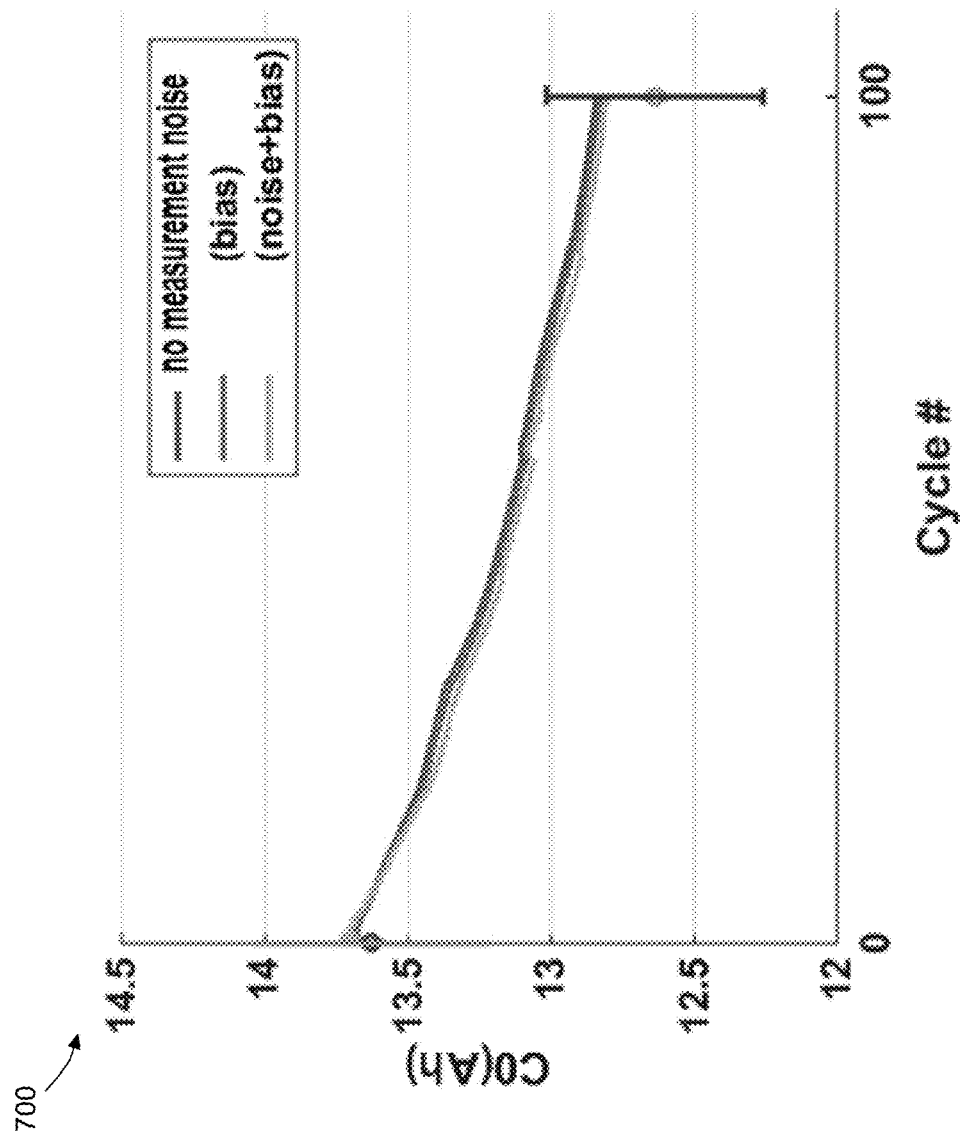
FIG. 7 is another graph depicting estimated battery capacity measurements that are generated using an embodiment of the system of FIG. 1 and the process of FIG. 2.

FIG. 5-FIG. 7 depict graphs of the SoH estimates that are generated in one practical embodiment of the system 100 that performs the process 200 to estimate the OCV, SoC, and SoH levels of a battery while the battery provides electrical power to a load. FIG. 5 depicts a graph 500 of the SoH estimates (measured in units of amp-hours Ah) for a battery over an extended series of charge and discharge operations over a period of approximately 2,500 hours of operation. In the graph 500 the total capacity generally decreases over time, which is expected as the battery ages, and the system 100 can generate accurate estimates of the SoH for the battery even in the presence of noise in the measurement data from sensors in the battery pack. FIG. 6 depicts a similar graph 600 that includes a more detailed view 650 of the SoH estimates for the battery when the battery is still new and there is minimal historical information about changes in SoC and charge to use in generating estimates for the SoH. The system 100 performs the process 200 to converge to an accurate estimate of the SoH within a few hours of the operational life of the battery. FIG. 7 depicts another graph 700 of the SoH estimates for a battery that the system 100 generates using the process 200. FIG. 7 depicts accurate SoH estimates that are generated with both the presence of noise in the sensor data and in the presence of a systemic measurement bias that may occur in certain embodiments of the voltage sensor 116 and current sensor 120 in the battery pack 104. As depicted in the graph 700, the system 100 still generates accurate SoH estimates even in the presence of measurement noise and bias.

It will be appreciated that variants of the above-disclosed and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed is:

1. A method for monitoring a battery while the battery is connected to a load comprising:

measuring, with a current sensor, a first current level flowing through the battery to the load at a first time;

measuring, with a voltage sensor, a first voltage level between a first terminal and a second terminal of the battery that are each connected to the load at the first time;

generating, with a controller operatively connected to the current sensor and the voltage sensor, a first estimated open cell voltage (OCV) of the battery at the first time based on the first current level, the first voltage level, and a predetermined model of the battery stored in a memory operatively connected to the controller;

identifying, with the controller, a first excitation level of the battery at the first time based on the first voltage level, the first current level and a cost optimization process; and identifying, with the controller, at least one of a first state of charge (SoC) and a state of health (SoH) of the battery using the first estimated OCV only in response to the first excitation level being below a predetermined threshold, wherein the cost optimization process implements a cost function that generates a measurement corresponding to the first excitation level, wherein the cost optimization function uses the first voltage level and the first current level as inputs, and wherein the cost function is selected to minimize an error between the first excitation level and the inputs.

2. The method of claim 1, the generating of the first estimated OCV further comprising:

identifying, with the controller, a polarization voltage in the battery model based on the first current level that flows through a first predetermined resistance and a second predetermined resistance in the predetermined model of the battery; and generating, with the controller, the first estimated OCV based on a difference between the first voltage level and the polarization voltage.

3. The method of claim 1 the identifying of the first excitation level further comprising:

measuring, with a temperature sensor, a first temperature level of the battery at the first time; and identifying, with the controller, the first excitation level of the battery at the first time based on the first voltage level, the first current level, the first temperature level, and the cost optimization process.

4. The method of claim 3 the identifying of the first excitation level further comprising:

identifying, with the controller, a first rate of change of current flowing through the battery at the first time based on a plurality of current measurements from the current sensor;

identifying, with the controller, a second rate of change of voltage between the first terminal and the second terminal of the battery at the first time based on a plurality of voltage measurements from the voltage sensor;

identifying, with the controller, a third rate of change of temperature of the battery at the first time based on a plurality of temperature measurements from the temperature sensor; and identifying, with the controller, the first excitation level of the battery based on a a four-element vector including the first current level, the first rate of change of current, the second rate of change of voltage, and the third rate of change of temperature using the cost optimization process, wherein the four-element vector is normalized by identifying a total magnitude of the vector based on the magnitudes of the first current level, the first rate of change of current, the second rate of change of voltage, and the third rate of change of temperature using the cost optimization process.

5. The method of claim 1 further comprising:
identifying, with the controller, the first SoC based on a predetermined mapping between the first estimated OCV and SoC levels stored in the memory,
wherein the predetermined mapping is implemented by lookup table.

6. The method of claim 1 further comprising:
measuring, with the current sensor, a second current level flowing through the battery to the load at a second time;
measuring, with the voltage sensor, a second voltage level between the first terminal and the second terminal of the battery that are each connected to the load at the second time;
generating, with the controller, a second estimated OCV of the battery at the second time based on the second current level, the second voltage level, and the predetermined model of the battery;
identifying, with the controller, an accumulated charge that is produced by the battery based on a plurality of current measurements from the current sensor between the first time and the second time;
identifying, with the controller, a second excitation level of the battery at the second time based on the second voltage level, the second current level and the cost optimization process;
identifying, with the controller, the first SoC at the first time using the first estimated OCV only in response to the first excitation level being below the predetermined threshold;
identifying, with the controller, a second SoC at the second time using the second estimated OCV only in response to the second excitation level being below the predetermined threshold; and
identifying, with the controller, the SoH based on a difference between the first SoC and the second SoC and the accumulated charge.

7. The method of claim 1 further comprising:
generating, with an output device operatively connected to the controller, at least one of a visual and audible output corresponding to the first estimated OCV, first SoC, or SoH of the battery.

8. A battery management system comprising:
a memory; and
a controller configured to be operatively connected to a current sensor that measures a current flow through a battery to a load, a voltage sensor that measures a voltage level between a first terminal and a second terminal of the battery that are each connected to the load, and the memory, the controller being configured to:
receive a measurement of a first current level flowing through the battery to the load at a first time from the current sensor;
receive a measurement of a first voltage level between the first terminal and the second terminal of the battery that are each connected to the load at the first time from the voltage sensor;
generate a first estimated open cell voltage (OCV) of the battery at the first time based on the first current level, the first voltage level, and a predetermined model of the battery stored in the memory;
identify a first excitation level of the battery at the first time based on the first voltage level, the first current level and a cost optimization process; and
identify at least one of a first state of charge (SoC) and a state of health (SoH) of the battery using the first estimated OCV only in response to the first excitation level being below a predetermined threshold,
wherein the cost optimization process implements a cost function that generates a measurement corresponding to the first excitation level,
wherein the cost optimization function uses the first voltage level and the first current level as inputs, and
wherein the cost function is selected to minimize an error between the first excitation level and the inputs.

9. The battery management system of claim 8, the controller being further configured to:
identify a polarization voltage in the predetermined model of the battery based on the first current level that flows through a first predetermined resistance and a second predetermined resistance in the battery model; and
generate the first estimated OCV based on a difference between the first voltage level and the polarization voltage.

10. The battery management system of claim 8, the controller being configured to be operatively connected to a temperature sensor that measures a temperature of the battery, the controller being further configured to:
receive a measurement of a first temperature level of the battery at the first time from the temperature sensor; and
identify the first excitation level of the battery at the first time based on the first voltage level, the first current level, the first temperature level, and the cost optimization process.

11. The battery management system of claim 10, the controller being further configured to:
identify a first rate of change of current flowing through the battery at the first time based on a plurality of current measurements from the current sensor;
identify a second rate of change of voltage between the first terminal and the second terminal of the battery at the first time based on a plurality of voltage measurements from the voltage sensor;
identify a third rate of change of temperature of the battery at the first time based on a plurality of temperature measurements from the temperature sensor; and
identify the first excitation level of the battery based on a a four-element vector including the first current level, the first rate of change of current, the second rate of change of voltage, and the third rate of change of temperature using the cost optimization process,
wherein the four-element vector is normalized by identifying a total magnitude of the vector based on the magnitudes of the first current level, the first rate of change of current, the second rate of change of voltage, and the third rate of change of temperature using the cost optimization process.

12. The battery management system of claim 8, the controller being further configured to:

identify the first SoC based on a predetermined mapping between the first estimated OCV and SoC levels stored in the memory, wherein the predetermined mapping is implemented by lookup table.

13. The battery management system of claim 8, the controller being further configured to:

receive a measurement of a second current level flowing through the battery to the load at a first time from the current sensor;

receive a measurement of a second voltage level between the first terminal and the second terminal of the battery that are each connected to the load at the second time from the voltage sensor;

generate a second estimated OCV of the battery at the second time based on the second current level, the second voltage level, and the predetermined model of the battery;

identify an accumulated charge that is produced by the battery based on a plurality of current measurements received from the current sensor between the first time and the second time;

identify a second excitation level of the battery at the second time based on the second voltage level, the second current level and the cost optimization process;

identify the first SoC at the first time using the first estimated OCV only in response to the first excitation level being below the predetermined threshold;

identify a second SoC at the second time using the second estimated OCV only in response to the second excitation level being below the predetermined threshold; and identify the SoH based on a difference between the first SoC and the second SoC and the accumulated charge.

14. The battery management system of claim 8 further comprising:

an output device; and the controller being operatively connected to the output device and further configured to:

generate least one of a visual and audible output corresponding to the first estimated OCV, first SoC, or SoH of the battery with the output device.

15. The battery management system of claim 8 wherein the battery, the current sensor, the voltage sensor, and the controller are integrated into a battery pack.

16. The battery management system of claim 8 wherein the battery further comprises a plurality of battery cells.

* * * * *